United States Patent
Yeo et al.

(10) Patent No.: US 6,864,519 B2
(45) Date of Patent: Mar. 8, 2005

(54) CMOS SRAM CELL CONFIGURED USING MULTIPLE-GATE TRANSISTORS

(75) Inventors: Yee-Chia Yeo, Hsin-Chu (TW); Chenming Hu, Hsinchu (TW); Fu-Liang Yang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 121 days.

(21) Appl. No.: 10/305,728

(22) Filed: Nov. 26, 2002

(65) Prior Publication Data

US 2004/0099885 A1 May 27, 2004

(51) Int. Cl.[7] ............................................. H01L 27/11
(52) U.S. Cl. ................ 257/206; 257/208; 257/369; 257/410
(58) Field of Search ................ 257/204, 206, 257/208, 315, 316, 319, 320, 321, 369, 410, 411

(56) References Cited

U.S. PATENT DOCUMENTS

| | | | | |
|---|---|---|---|---|
| 5,317,178 A | * | 5/1994 | Wu | 257/314 |
| 5,814,895 A | * | 9/1998 | Hirayama | 257/206 |
| 6,157,061 A | * | 12/2000 | Kawata | 257/316 |
| 6,380,024 B1 | * | 4/2002 | Liaw | 438/238 |
| 6,573,549 B1 | * | 6/2003 | Deng et al. | 257/296 |
| 2003/0042528 A1 | * | 3/2003 | Forbes | 257/315 |
| 2003/0178670 A1 | * | 9/2003 | Fried et al. | 257/315 |

* cited by examiner

Primary Examiner—Stephen W. Smoot
(74) Attorney, Agent, or Firm—Tung & Associates

(57) ABSTRACT

A complementary metal-oxide-semiconductor static random access memory cell that is formed by a pair of P-channel multiple-gate field-effect transistors (P-MGFETs), a pair of N-channel multiple-gate field-effect transistors (N-MGFETs), a second pair of N-MGFETs that has a drain respectively connected to a connection linking the respective drain of the N-MGFET of the first pair of N-MGFET to the drain of the P-MGFET of the pair of P-MGFETs; a pair of complementary bit lines, each respectively connected to the source of the N-MGFET of the second pair of N-MGFETS; and a word line connected to the gates of the N-MGFETs of the second pair of N-MGFETs.

57 Claims, 7 Drawing Sheets

CMOS SRAM CELL CONFIGURED USING MULTIPLE-GATE TRANSISTORS

FIELD OF THE INVENTION

The present invention generally relates to the field of CMOS Static Random Access Memory (SRAM) devices, and more particularly, to an SRAM cell formed by multiple-gate field-effect transistors (MGFETS).

BACKGROUND OF THE INVENTION

A conventional complementary metal-oxide-semiconductor (CMOS) static random access memory (SRAM) cell 10 typically consists of six metal-oxide-semiconductor field effect transistors (MOSFETs): two P-channel field-effect transistors (PFETs) for a pull-up operation, two N-channel field-effect transistors (NFET) for a pull-down operation, and two NFETs for input/output access, i.e., pass-gate access, is shown in FIG. 1A. P1 and N1 form an inverter 12, which is cross-coupled with another inverter consisting of P2 and N2. The devices 16, 18 labeled NL and NR are pass-gate access devices which control reading from and writing into the SRAM cell 10. The corresponding layout for the circuit 10 is shown in FIG. 1B. For the sake of simplicity, metal layout shapes are not shown. In the particular layout, the word line (WL) is shown along the horizontal direction. The left bit line BL, the right bit line BR, and the ground line GND are also shown.

A conventional SRAM array consists of m rows and n columns of the aforementioned SRAM cells. Cells of the same row share one WL 20, while cells of the same column share the same bit line pair 22, 24 consisting of BL and BR. The aforementioned design is used in many SRAMS, including for example, a 1-mega-bit memory having typically 1024 by 1024 cells.

During standby, all the WLs are at low (i.e., at GND level) and all the bit lines are biased to the standby voltage level (of the power supply) $V_{dd}$. Thus, the NFET pass-gate devices NL and NR of all the cells are shut off. A data bit 1 is maintained with P1 and N2 on, and P2 and N1 off, such that the left cell node CL is high (i.e. at $V_{dd}$) while CR is low (GND). Correspondingly, a data bit 0 is maintained when P2 and N1 are on, and P1 and N2 are off, which forces the right cell node CR to high (i.e., $V_{dd}$) and the left cell node CL to GND. During access time, one WL is selected by being switched on (to $V_{dd}$) such that half of the PFET pass-gate devices along the selected WL are turned on simultaneously. For each cell along the selected WL, one pass-gate device is turned on.

During a read access operation, either BL or BR are pulled down from their high (at $V_{dd}$) by the cell. BL is pulled down if the cell is at 0, whereas BR is pulled down if the cell is at 1. A bit select multiplexor then steers the selected bit pair(s) to appropriate sense amplifiers to generate the digital signals for external circuitry requesting the read memory operation. The sense signals developed along the unselected bit columns are ignored. The cells along the selected WL that were not selected are referred to as the "half-selected" cells.

During a write access operation, the bit select circuitry steers the input data into the selected bit pairs. To write a 1, BL is driven to high (i.e., $V_{dd}$) and BR to low (i.e., to GND), shutting off N1 and P2, while turning on N2 and P1. To write a 0, BL is forced to low and BR to high. Along the unselected bit columns, BL and BR are coupled to VDD and are gradually pulled down by the "half-selected" cells, as previously described in the read operation. Thus, during a read access operation, all the cells along the selected WL are disturbed since one NFET pass-gate device of each SRAM cell remains on. During a write access, all the "half-selected" cells are similarly disturbed as during the read operation. When a cell is at 0, the left cell node CL is at GND. When WL is raised to high (i.e., $V_{dd}$), the pass-gate device NL switches on, raising BL to VDD and pulling the left cell node up. Thus, NL and N1 act as a potential divider at the left cell node CL between $V_{dd}$ and GND. To prevent the left cell node CL from rising beyond the threshold voltage of N2, the conductance of N1 must be larger than the conductance of NL. Otherwise, N2 turns on, pulling down the node CR, switching P1 on, and raising the node CL from GND to Vdd. In such an instance, the cell is disturbed from its 0 state to a 1 state.

Thus, the ratio of the conductance of N1 over the conductance of NL is a basic metric to measure the stability of the SRAM cell or the ability of the cell to retain its data state. This ratio is referred to by CMOS SRAM designers as "beta" or "beta ratio". It is defined as the ratio of the conductance of the pull-down device over the conductance of pass-gate device. The larger the beta ratio, the cell becomes more stable, and its static noise margin (SNM) increases.

The conductance of a transistor is approximately proportional to the effective carrier mobility $\mu_{eff}$ and to the ratio of the device width to the channel length (W/L). The beta of the SRAM cell can be approximated by the ratio of of $\mu_{eff}$(W/L) of transistor N1 and $\mu_{eff}$(W/L) of transistor NL. If N1 and NL have the same channel length, then the beta ratio becomes the ratio of the channel width of N1 over the channel width of NL. Depending on the SRAM application, beta ranges from 1.8 to 3.

It is known that writability is the obverse of stability. The more stable the cell the more difficult it will be to write the cell into a different state. As indicated above, a cell design with a narrower pass-gate device will be more stable, but as the current through such a device is smaller. It will require more time to develop a signal of a given magnitude on the bit line. The rate at which the cell can pull down a bit line is limited by the series combination of the pull-down device and the pass-gate device, and is increased by increasing the conductance of either or both devices. For minimum read delay, the widths of both devices should therefore be as wide as possible. In practice, the cell size and the desired beta ratio limit the size of the devices.

The reduction in the size of MOSFETs has provided continued improvement in speed performance, size, and density of SRAM chips. However, as the gate length of the conventional bulk MOSFET is reduced, it suffers from problems related to the inability of the gate to substantially control the on and off states of the channel. Phenomena such as reduced gate control associated with the transistors with short channel lengths are termed short-channel effects. Increased body doping concentration, reduced gate oxide thickness, and ultra-shallow source/drain junctions are ways to suppress short-channel effects. FIGS. 2A and 2B show the cross-sectional views of conventional MOSFETs 30, 40 formed on bulk silicon substrate 26 and on silicon-on-insulator substrate 28. The MOSFETs of FIGS. 2A and 2B are used to configure the SRAM cell 10 shown in FIGS. 1A and 1B.

For device scaling well into the sub-30-nm regime, the requirements for body-doping concentration, gate oxide thickness, and source/drain (S/D) doping profiles become increasingly difficult to meet when conventional device structures based on bulk silicon (Si) substrates are employed. For device scaling well into the Sub-30-nm regime, a promising approach for controlling short-channel effects is to use an alternative device structure with multiple-gates. Examples of multiple-gate transistor structures include the double-gate transistor structure, triple-gate transistor structure, and the omega-FET structure. A multiple-gate field-effect transistor (MGFET) structure is expected to extend the scalability of CMOS technology beyond the limitations of the conventional bulk MOSFET and realize the ultimate limit of silicon MOSFETs. The introduction of additional gates improves the capacitance coupling between the gates and the channel, increases the control of the channel potential by the gate, helps suppress short channel effects, and prolongs the scalability of the MOS transistor.

While there is some work on the design and fabrication of multi-gate devices such as the double-gate and triple-gate devices, there is little work on circuits, such as inverter circuits and static random-access memory (SRAM) cells, configured using such devices. The relentless pursuit of high performance has pushed logic and circuit designers to utilize every delay and area optimization technique at their disposal. However, the optimization of circuits, such as SRAM cells, incorporating multiple-gate transistors has not been addressed. Since the performance of CMOS SRAM circuits depend significantly on the beta ratio, it is crucial to make avail a simple method to provide optimal P/N width ratios for inverters incorporating multiple-gate transistors. Moreover, the use of multiple-gate transistors may result in significant savings in the layout area in the case where small device width transistors in the conventional SRAM cell are replaced with multiple-gate transistors comprised of tall fins. This is especially true when the number of fins constituting each multiple-gate transistor is small, for example, less than or equal to three.

It is therefore an object of the present invention to provide a SRAM cell comprising multiple-gate field-effect transistors (MGFETs).

It is another object of the present invention to provide a SRAM cell with an adjustable beta ratio between the pull-down and pass-gate multiple-gate devices.

It is a further object of the present invention to provide savings in layout area of the SRAM cell.

It is yet another object of the present invention to provide an array of SRAM cells configured using multiple-gate field-effect transistors.

SUMMARY OF THE INVENTION

In accordance with the present invention, a complementary metal-oxide-semiconductor static random access memory cell is provided.

In a preferred embodiment, a complementary metal-oxide-semiconductor static random access memory cell is provided which includes a pair of P-channel multiple-gate field-effect transistors (P-MGFETs), each of the P-MGFETs has a source connected to a common voltage potential and a gate connected to a drain of the other P-MGFET; a pair of N-channel multiple-gate field-effect transistors (N-MGFETs), each of the N-MGFETs has a drain connected to the drain of the respective P-MGFET of the pair of P-MGFETs, a source connected to ground, and a gate connected to the drain of an opposite P-MGFET of the pair of P-MGFETs; a second pair of N-MGFETs that has a drain respectively connected to a connection linking the respective drain of the N-MGFET of the first pair of N-MGFETs to the drain of the P-MGFET of the pair of P-MGFETs; a plurality of complementary bit lines, each of said plurality of bit lines respectively connected to the source of the N-MGFET of the second pair of N-MGFETS; and a word line connected to the gates of the N-MGFETs of the second pair of N-MGFETs.

In the complementary metal-oxide-semiconductor static random access memory cell, the pair of P-channel multiple-gate field-effect transistors are pull-up devices and the first pair of N-channel multiple-gate field-effect transistors are pull-down devices. The first P-MGFET of the pair of P-MGFETs and the first N-MGFET of the first pair of N-MGFETs form a first inverter, while the second P-MGFET of the pair of P-MGFETs and the second N-MGFET of the first pair of N-MGFETs form a second inverter, the first and the second inverters are cross-coupled to each other. The conductivity of each of the first pair of N-MGFETS is larger than the conductivity of each of the second pair of N-MGFETs. The P-channel or N-channel multiple-gate field-effect transistors are double-gate field-effect transistors, or the P-channel or N-channel multiple-gate field-effect transistors may be triple-gate field-effect transistors, or the P-channel or N-channel multiple-gate field-effect transistors may be omega field-effect transistors.

In the complementary metal-oxide-semiconductor static random access memory cell, the P-channel or N-channel multiple-gate field-effect transistors may each include a substrate that has an insulating layer on a top surface; at least one semiconductor fin formed vertically on the top surface of the substrate, the at least one fin has a top surface and two sidewall surfaces; a gate dielectric layer overlying the at least one semiconductor fin; at least one gate electrode wrapping around the at least one semiconductor fin on the top surface and the two sidewall surfaces overlying the gate dielectric layer; and source and drain regions separated by the at least one gate electrode. The at least one semiconductor fin may be at least two semiconductor fins each having a width different than the other. The at least one semiconductor fin may be formed of silicon, or may be formed of silicon and germanium. The insulating material layer may be formed of a dielectric material, or may be formed of silicon oxide to a thickness between about 20 Å and about 1000 Å. The gate dielectric layer may be formed of silicon oxide, or may be formed of silicon oxynitride. The gate dielectric layer may further be formed of a high permittivity material selected from the group consisting of $La_2O_3$, $Al_2O_3$, $HfO_2$, HfON and $ZrO_2$. The gate dielectric layer may be formed of a high permittivity material that has a relative permittivity of at least 5. The gate dielectric layer may have a thickness between about 3 Å and about 100 Å. The gate dielectric layer may have a first thickness on the top surface of the fin and a second thickness on the sidewall surfaces of the fin, wherein the first thickness is different than the second thickness, or wherein the first thickness is smaller than the second thickness. A thickness of the gate dielectric layer on the top surface of the semiconductor fin may be less than 20 Å.

In the complementary metal-oxide-semiconductor static random access memory cell, the at least one gate electrode may be formed of polycrystalline silicon, or may be formed of polycrystalline silicon germanium, or may be formed of a metal. Each of the first pair or N-MGFETs may include a first number of fins, each of the second pair of N-MGFETs may include a second number of fins, the first number may be different than the second number. The first pair of N-MGFETs shares the at least one semiconductor fin with the second pair of N-MGFETs. The first pair of N-MGFETs and the second pair of N-MGFETs may not share any of the at least one semiconductor fin. The contacts between the gate electrode and the source and drain regions are on at least one of the sidewall surfaces and the top surface of the at least one semiconductor fin.

The present invention is further directed to an array of static random access memory cells formed by a plurality of SRAM cells arranged in an n by m matrix, wherein n and m are integers greater than 1, and wherein each SRAM cell includes a pair of P-channel multiple-gate field-effect transistors (P-MGFETs), each of the P-MGFETs has a source connected to a common voltage potential and a gate connected to a drain of the other P-MGFET; a first pair of N-channel multiple-gate field-effect transistors (N-MGFETs), each of the first pair of N-MGFETs has a drain connected to the drain of the respective P-MGFET of the pair of P-MGFETs, a common source connected to ground, and a gate connected to the drain of an opposite P-MGFET of the pair of P-MGFETs; a second pair of N-MGFETs that has a drain respectively connected to a connection linking the respective drain of the N-MGFET of the first pair of N-MGFETs to the drain of the P-MGFET of the pair of P-MGFETs; a pair of complementary bit lines, each of the complementary bit lines respectively connected to the source of the N-MGFET of the second pair of N-MGFETs; a plurality of word lines, each of the word lines connected to the gates of the N-MGFETs of the second pair of N-MGFETS; n pairs of complementary bit lines, each of the n pairs of the complementary bit lines linking respective sources of the N-MGFETs of the second pair of N-MGFETs of each of the SRAM cells to form columns of the array; and m word lines, each of the m word lines linking respective gates of the N-MGFETs of the second pair of N-MGFETs of each SRAM cells to form rows of the array.

In the array of static random access memory cells, the pair of P-channel multiple-gate field-effect transistors are pull-up devices and the first pair of N-channel multiple-gate field-effect transistors are pull-down devices. A first P-MGFET of the pair of P-MGFETs and a first N-MGFET of the first pair of N-MGFETs form a first inverter, and a second P-MGFET of the pair of P-MGFETs and a second N-MGFET of the first pair of N-MGFETs form a second inverter, the first and second inverters are cross-coupled to each other. A conductivity of each of the first pair of N-MGFETs is larger than a conductivity of each of the second pair of N-MGFETs. The P-channel or N-channel multiple-gate field-effect transistors may be double-gate field-effect transistors, or may be triple-gate field-effect transistors, or may be omega field-effect transistors.

In the array of static random access memory cells, each of the P-channel or N-channel multiple-gate field-effect transistors may further include a substrate that has an insulating layer on a top surface; at least one semiconductor fin formed vertically on the top surface of the substrate, each fin has a top surface and two sidewall surfaces; a gate dielectric layer overlying the at least one semiconductor fin; a gate electrode wrapping around the at least one semiconductor fin on the top surface and the two sidewall surfaces overlying the gate dielectric layer; and source and drain regions separated by the gate electrode. The at least one semiconductor fin may be at least two semiconductor fins, each has a width different than the other. The at least one semiconductor fin may be formed of silicon, or may be formed of silicon and germanium. The insulating layer may include a dielectric material, or may include silicon oxide. The insulating layer may have a thickness between about 20 Å and about 1000 Å. The gate dielectric layer may be formed of silicon oxide, or may be formed of silicon oxynitride, or may be formed of a high permittivity material selected from the group consisting of $La_2O_3$, $Al_2O_3$, $HfO_2$, HfON and $ZrO_2$. The gate dielectric layer may include a high permittivity material that has a relative permittivity of at least 5. The gate dielectric layer may have a thickness between about 3 Å and about 100 Å. The gate dielectric layer may have a first thickness on the top surface of the fin and a second thickness on the sidewall surfaces of the fin. The first thickness may be different than the second thickness, or the first thickness may be smaller than the second thickness. A thickness of the gate dielectric layer on the top surface of the semiconductor fin may be less than 20 Å. The gate electrode may be formed of polycrystalline silicon, may be formed of polycrystalline silicon germanium, or may be formed of a metal. Each of the first pair of N-MGFETs may include a first number of semiconductor fins, each of the second pair of N-MGFETs may include a second number of semiconductor fins, the first number may be different than the second number. The first pair of N-MGFETs may share a plurality of semiconductor fins with the second pair of N-MGFETs, or the first pair of N-MGFETs and the second pair of N-MGFETs may not share any semiconductor fins.

BRIEF DESCRIPTION OF THE DRAWINGS

These and other objects, features and advantages of the present invention will become apparent from the following detailed description and the appended drawings in which:

FIGS. 8A, 8B and 8C are cross-sectional views and plane view for a triple-gate device structure and a triple-gate structure with recessed insulator, respectively.

DETAILED DESCRIPTION OF THE PREFERRED EMBODIMENT

Figure 1A:
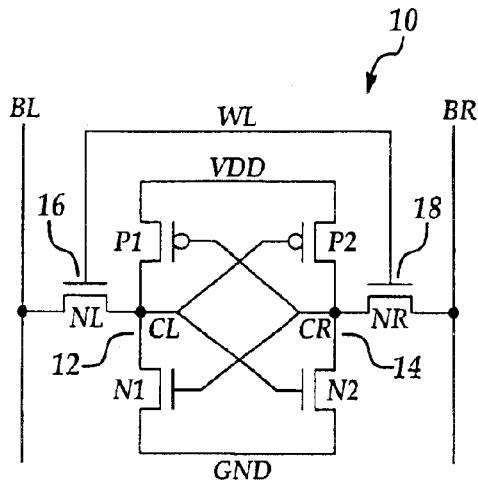
FIGS. 1A and 1B are schematic diagrams of a conventional six-transistor static random access memory cell formed using conventional transistors.
Figure 1B:
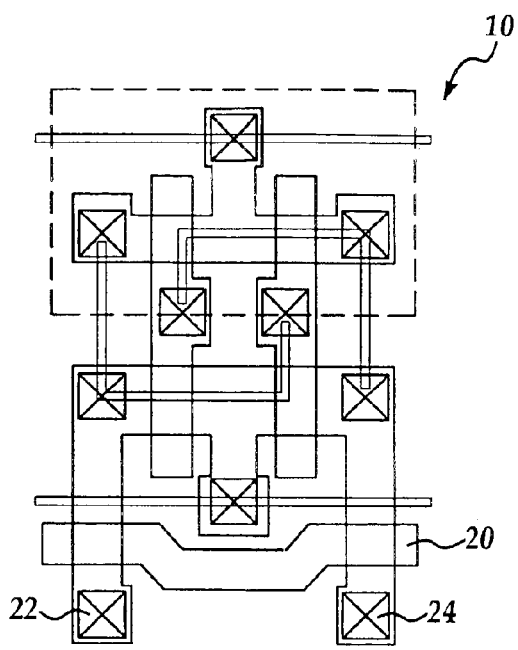
Figure 2A:
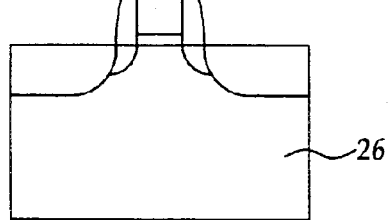
FIGS. 2A and 2B are enlarged, cross-sectional views illustrating conventional transistors formed on bulk silicon substrate and on silicon-on-insulator substrate, respectively.
Figure 2B:
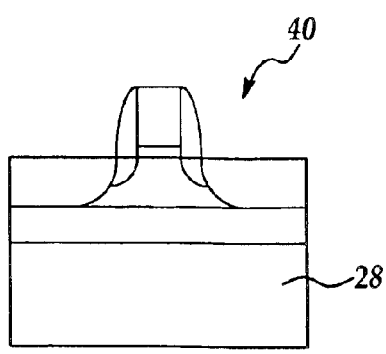

Conventional SRAM cells, an example of which is depicted in FIGS. 1A and 1B are comprised of conventional transistors formed on bulk silicon substrates or silicon-on-insulator substrates. At present, there is no report on the incorporation of multiple-gate field-effect transistors (MGFETS) in an SRAM cell and the optimization of such an SRAM cell.

Figure 3A:
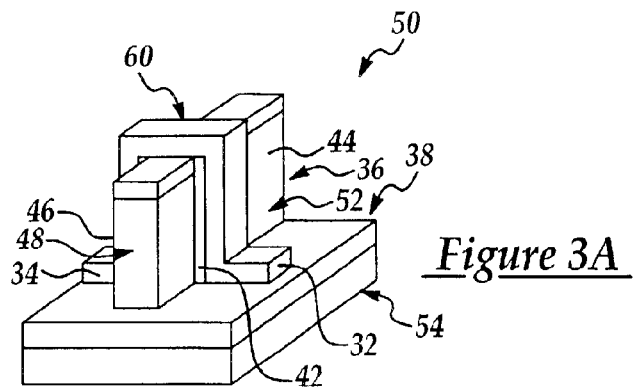
FIGS. 3A, 3B and 3C are illustrations of a present invention double-gate transistor in a perspective view, in a cross-sectional view and in a plane view, respectively.
Figure 3B:
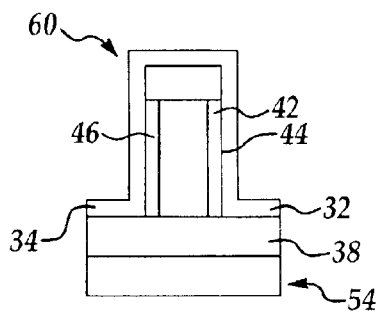
Figure 3C:
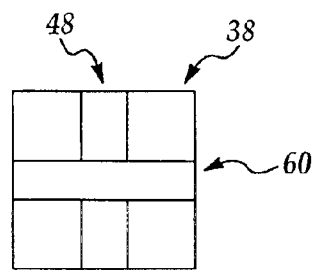

One example of the present invention multiple-gate field-effect transistor is a double-gate field-effect transistor (FET) structure 50, shown in FIGS. 3A–3C, where there are two gate electrodes 32,34 positioned on the opposing sides of the channel or silicon body 36. Referring now to FIG. 3A, the double-gate fin FET structure 50 is comprised of a thin semiconductor fin 36 formed on an insulative substrate 38 (e.g., silicon oxide) and defined using an etchant mask. In a preferred embodiment, the semiconductor fin 36 is comprised of silicon. In another embodiment, it may be comprised of an alloy semiconductor such as silicon-germanium (SiGe). A gate dielectric layer 42 wraps around the silicon fin 36 in the channel region and two gate electrodes 32, 34 straddle across the silicon fin 36 to form a double-gate structure: a gate on each of the two sidewalls 44, 46 of the fin 36. The gate dielectric layer 42 may include a conventional dielectric material such as silicon dioxide or silicon oxynitride with a thickness ranging from about 3 Å to about 100 Å, preferably 10 Å or less. The gate dielectric layer 42 may also be comprised of high permittivity (high-k) materials such as lanthalum oxide $La_2O_3$, aluminum oxide $Al_2O_3$, hafnium oxide $HfO_2$, hafnium oxynitride HfON, or zirconium oxide ZrO2, with an equivalent oxide thickness of 3 Å to about 100 Å.

The source 48 and drain 52 of the double-gate structure 50 are separated by the gate electrodes 32, 34. In general, the U-shaped gate electrode 60 may be formed of a material such as polycrystalline silicon (poly-Si), polycrystalline silicon-germanium (poly-SiGe), a refractory metal such as molybdenum and tungsten, compounds such as titanium nitride, or other conducting materials. The cross-section of the double-gate transistor 50 (through its channel region) on the plane containing A–A' is illustrated in FIG. 3B. Its plane view is shown in FIG. 3C. The device width w of a single fin 36 is defined to be twice the fin height h, that is, the width of the double-gate FET is equal to 2h. Multiple device widths may be achieved on the same substrate 54 by placing multiple fins in parallel, as illustrated in FIGS. 4A and 4B.

Figure 4A:
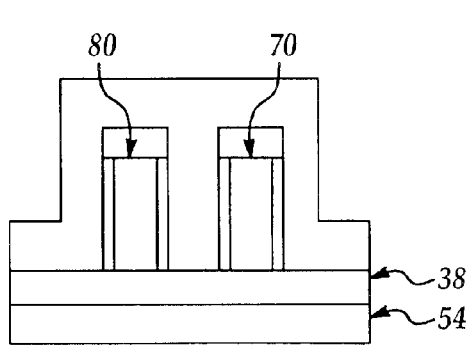
FIGS. 4A and 4B are illustrations of a present invention alternate embodiment of two double-gate devices connected in parallel shown in a cross-sectional view and in a plane view, respectively.
Figure 4B:
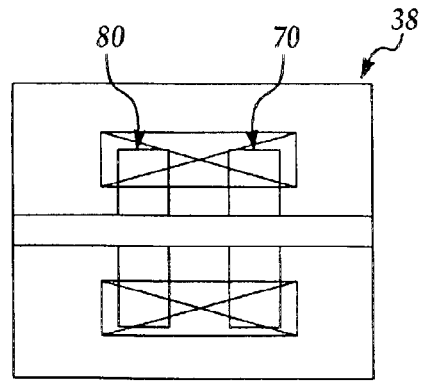

FIG. 4A shows the cross-sectional view in the plane of the channel region of two double-gate FETs 70, 80 connected in parallel. The width of the resulting parallel connection of two double-gate FETs is 4h.

Figure 5:
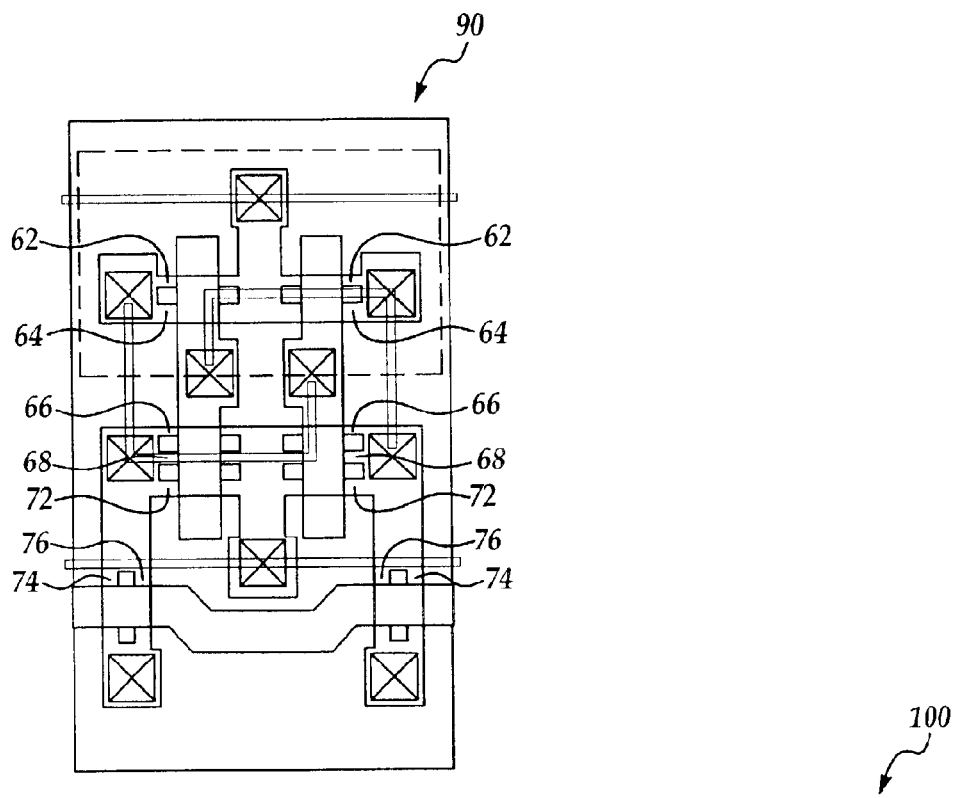
FIG. 5 is a layout diagram of a present invention SRAM cell configured using double-gate field-effect transistors.

According to the present invention, an SRAM cell 90 may be configured using the double-gate FET structure of FIGS. 3A, 3B and FIGS. 4A, 4B. As an example, a specific layout of an SRAM cell configured using double-gate FETs is shown in FIG. 5. The pull-up P-channel MGFETs (P-MGFETs) P1 and P2 are each formed using two fins 62,64. That is, P1 and P2 may each be regarded as comprised of two double-gate transistors connected in parallel. Two pull-down N-channel MGFETs (N-MGFETs) N1 and N2 are also provided, each with three fins 66, 68, 72. That is, each of the pull-down N-MGFETs may be regarded as being comprised of three double-gate transistors connected in parallel. If the fin height is h, the device width of N1 or N2 is equal to 6h.

Two N-MGFETs for input/output access, i.e., pass-gate access, labeled NL and NR are provided, each with two fins 74, 76. The device width of NL or NR is 4h. P1 and N1 form an inverter which is cross-coupled with another inverter consisting of P2 and N2. In the case where the channel lengths of the pull-down N-MGFETs are the same as those of the pass-gate transistor, the beta ratio of the SRAM cell of FIG. 5 is equal to 6h/4h. I.e., 3/2. The beta ratio is therefore the ratio of the number of fins used to form the pull-down N-MGFETs to the number of fins used to form the pass-gate access transistors, if the pull-down N-MGFETs and pass-gate access transistors have the same channel lengths. In general, the pull-down N-MGFETs and the pass-gate access transistors need not have the same channel lengths.

Figure 6:
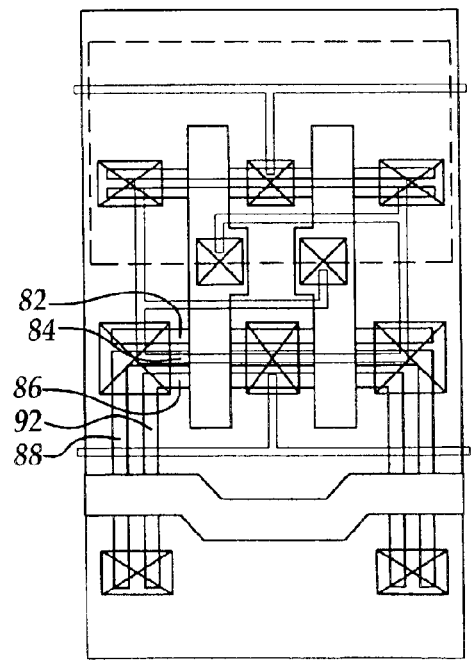
FIG. 6 is a layout diagram of another embodiment of the present invention SRAM cell configured using double-gate field-effect transistors.

In FIG. 6, another embodiment of the SRAM cell 100 configured using double-gate FETs is shown. In this embodiment, the contact holes expose the sidewalls of the fins, so that conductive contacts may additionally be made with the fin sidewall area. This increases the contact area and effectively reduce the contact resistance. Reduction of contact resistances is important for the achievement of high current drivability for enhancement of read/write speed. The pull-down N-MGFET labeled N1 is comprised of three fins 82, 84, 86, and the pass-gate access transistor NL is comprised of two fins 88, 92. The beta ratio of the SRAM cell 100 is 3/2, if the transistor N1 and the transistor NL have the same channel length.

Figure 7:
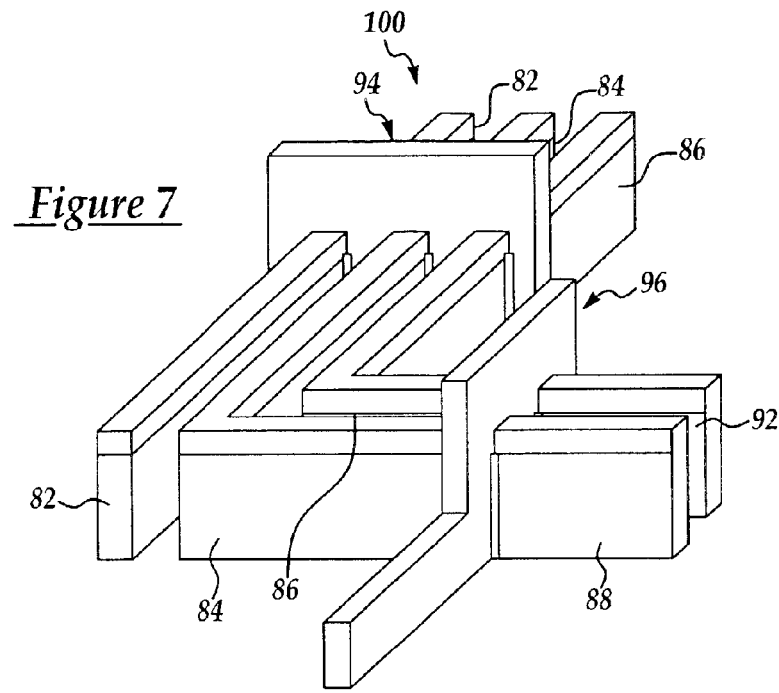
FIG. 7 is a perspective view of a portion of the present invention SRAM cell having N-channel pull-down double-gate field-effect transistor N1 and N-channel pass-gate double-gate field-effect transistor NL.

A three-dimensional perspective view of the fins and electrodes of transistors N1 and NL in the direction indicated in FIG. 6 is shown in FIG. 7. The three-dimensional perspective view clearly shows that transistor N1 comprises of three fins, 82 84, 86 straddled by a common gate electrode 94 while transistor NL comprises of two fins 88, 92 straddled by another gate electrode 96. In this specific example, two of the three fins 84, 86 of the pull-down transistors are joined together with the corresponding two fins 88, 92 of the pass-gate transistor. However, the three fins of transistor N1 and the two fins of transistor NL need not be joined together in general. That is, the fins of transistor N1 and the fins of transistor NL may be separate. In this specific example, the fins 82, 84, 86 and the fins 88, 92 may be oriented in the same direction.

It is advantageous to have the freedom of selecting an appropriate beta ratio to optimize the performance of an SRAM cell. It should be noted that the aforementioned SRAM cell configured using double-gate transistors is not able to offer a continuous range of beta ratio if the pull-down transistors and the pass-gate transistors have the same fin height and channel length. If two fins are used for the pull-down N-MGFET and one fin is used for the pass-gate N-MGFET, the beta ratio is 2. If five fins are used for the pull-down N-MGFET and two fins are used for the pass-gate N-MGFET, the beta ratio is 5/2. Variation of the fin width has no effect on the device width of the double-gate transistor. The beta ratio must therefore be a number given by a quotient of two integers. It cannot be continuously varied. For example, it is not straightforward to realize a P/N width ratio of 2.35 for an SRAM cell configured using the double-gate FETs of the same channel length.

The problem can be solved using multiple-gate transistors with a gate on the top surface of the silicon fin. Multiple-gate transistors with a gate on the top surface of the silicon fin include the triple-gate FET and the omega-FET.

Figure 8C:
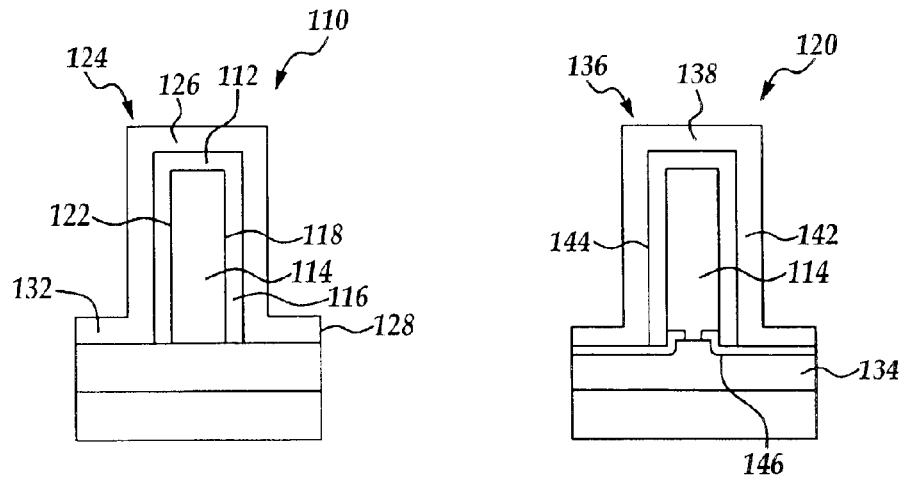
Figure 8C:
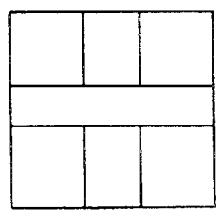
Figure 9A:
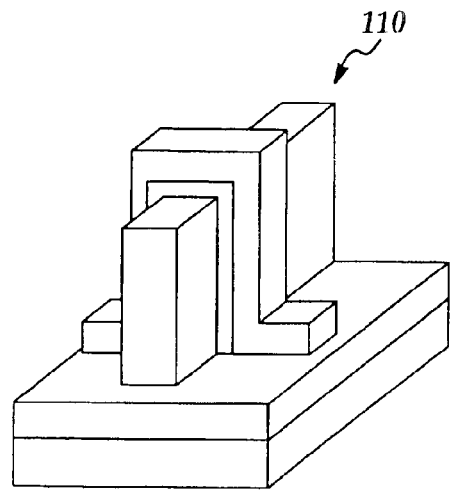
FIGS. 9A and 9B are perspective views of a present invention triple-gate device structure without and with recessed insulator, respectively.

FIG. 8A shows the cross-sectional view of a triple-gate transistor 110, through the channel region. The triple-gate transistor is similar to the double-gate transistor except for the absence of the mask on the top surface 112 of the semiconductor fin 114. The gate dielectric 116 wraps around the semiconductor fin 114 on three sides 112, 118, 122 in the channel region, and the gate electrode 124 straddles over the fin. The gate electrode 124 forms three gates: a gate 126 on the top surface 112 of the semiconductor fin 114 and a gate 128, 132 on each of the two sidewalls 118, 122 of the fin. The device width of the triple-gate FET 110 is given by the sum of the fin width and twice the fin height, i.e., (2h+w). Note that in this device structure, a variation of the fin width w changes the device width. The value of fin width w may be varied by altering the layout as schematically illustrated in FIG. 8C. A three-dimensional perspective of triple-gate FET 110 is shown in FIG. 9A.

Figure 9B:
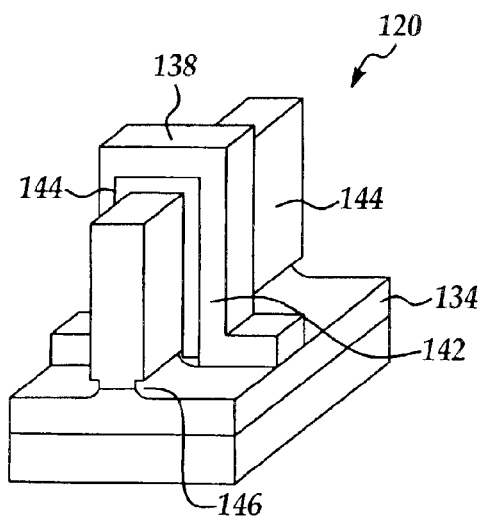

Triple-gate transistors 120 may have a recessed insulating layer 134 for improved gate control, as illustrated in FIG. 8B. A triple-gate transistor 120 with a recessed insulating layer is also known as the Omega ($\Omega$) field-effect transistor (FET) or simply omega-FET, since the gate electrode has an omega-shape in its cross-sectional view. The encroachment of the gate electrode 136 under the semiconductor fin 114 or body forms an omega-shaped gate structure. It closely resembles the Gate-All-Around (GAA) transistor for excellent scalability, and uses a very manufacturable process similar to that of the double-gate or triple-gate transistor. The omega-FET has a top gate 138, two sidewall gates 142, 144 and special gate extensions 146 or encroachments under the semiconductor body. The omega-FET is therefore a field effect transistor with a gate that almost wraps around the body. In fact, the longer the gate extension 146, i.e., the greater the extent of the encroachment E, the more the structure approaches or resembles the gate-all-around structure. A three-dimensional perspective of the triple-gate transistor 120 with recessed insulator, or omega-FET, is schematically illustrated in FIG. 9B. The encroachment of the gate electrode under the silicon body helps to shield the channel from electric field lines from the drain and improves gate-to-channel controllability, thus alleviating the drain-induced barrier lowering effect and improving short-channel performance. The encroachment of the gate electrode under the silicon body relies on an undercut of the insulating layer in the substrate, thus forming a notch in the substrate at the base of the silicon body. It should be noted that the device width of the omega-FET is given by the sum of the fin width w, twice the fin height h, and twice the encroachment E. Therefore, the device width is given by (w+2h+2E). A variation of the fin width for the omega-FET changes the device width.

It should be noted that the fin constituting the triple-gate transistor and the omega-FET may be formed of any semiconducting material such as silicon or germanium, or any alloy semiconductor such as silicon-germanium. The gate dielectric of the triple-gate transistor or omega-FET may be silicon oxide, silicon oxynitride, or any high-permittivity material. The thickness of the gate dielectric may range from 3 Å to 100 Å. The gate electrode may be comprised of any conductive material such as doped poly-si, doped poly-SiGe, metals such as molybdenum, or metallic nitrides such as titanium nitride.

Figure 10:
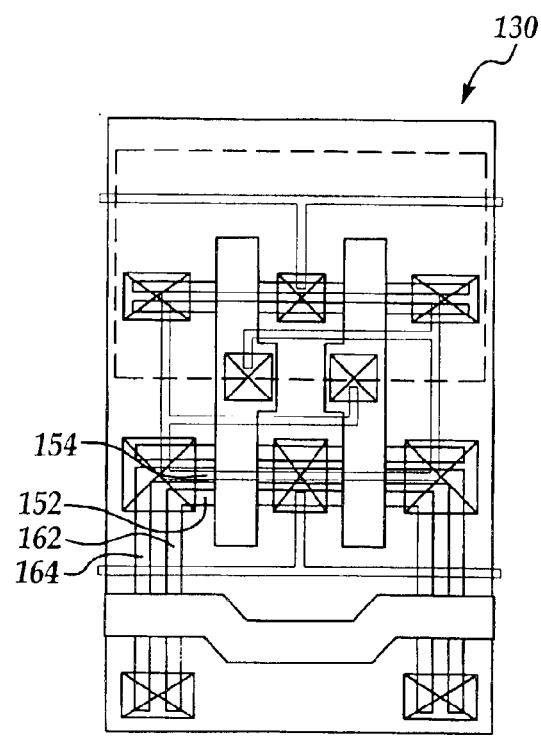
FIG. 10 is a layout diagram illustrating a present invention embodiment of SRAM cell configured using either triple-gate FETs or omega-FETs.
Figure 11:
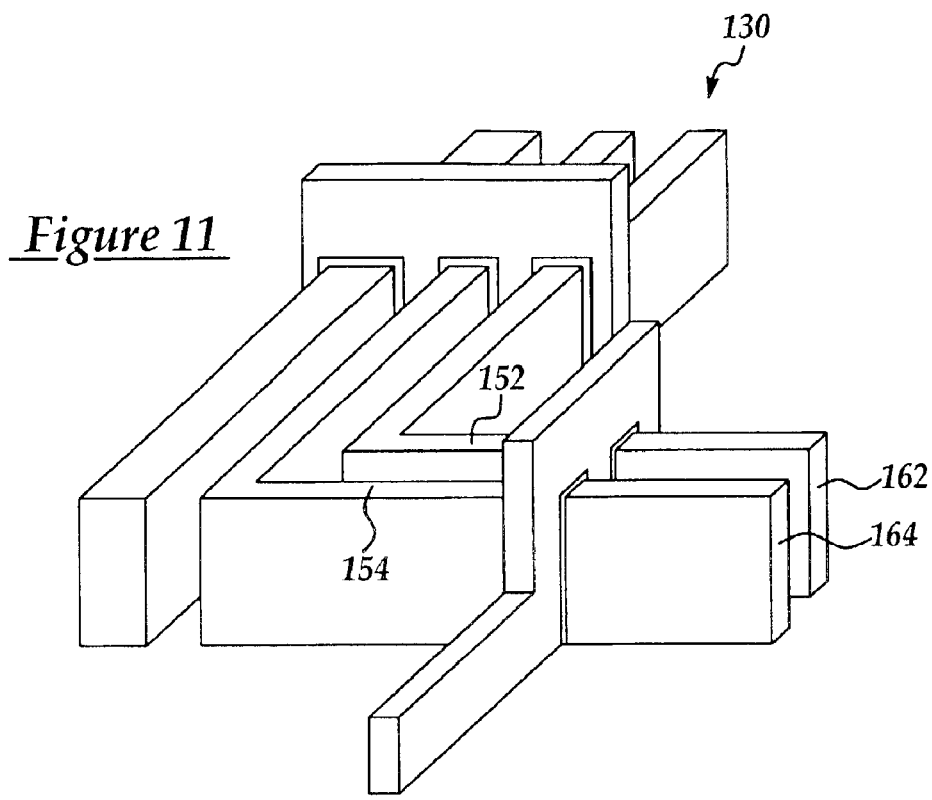
FIG. 11 is a perspective view of a portion of the present invention SRAM cell having N-channel pull-down triple-gate FET N1 and N-channel pass-gate triple-gate FET NL.

An SRAM cell 130 configured using multiple-gate transistors such as a triple-gate FET and an omega-FET is schematically shown in FIG. 10. In one embodiment of the present invention, the SRAM cell 130 is provided with the triple-gate transistors 110 of FIG. 8A. In another embodiment, the SRAM cell is provided with triple-gate transistors 120 with a recessed insulating layer, also known as omega-FETs, of FIG. 8B. In FIG. 10, the fin widths of the pull-up P-MGFETs, pull-down N-MGFETs, and pass-gate transistors are indicated. In general, the fin widths of the devices need not be the same. A three-dimensional perspective of the fins and electrodes of transistors N1 and NL in the direction indicated in FIG. 10 is shown in FIG. 11. In this example, transistor N1 and transistor NL share two fins. The first fin 152 of transistor N1 is common with the first fin 162 of transistor NL. The second fin 154 of transistor N1 is also common with the second fin 164 of transistor NL. Therefore, transistors N1 and NL may share a plurality of fins. The fins constituting transistor N1 and transistor NL may be separate, in which case they do not share any fins.

In addition, a fin need not have a uniform width, e.g., a first fin constituting transistor P1 and transistor P2 may have a width $w_{p1,1}$, in the region where P1 is formed and a width $w_{p2,1}$ in the region where P2 is formed. The nomenclature of the fin width is $w_{label,n}$ where the transistor label is included in the subscript and n indexes the $n^{th}$ fin constituting the labeled transistor. An additional degree of freedom in varying the device width is achieved since varying the fin width changes the device width. However, the fin width is seldom too large. For example, the fin width is seldom more than five times the gate length. If configured using triple-gate transistors, the beta ratio in the SRAM cell of FIG. 10 is given by:

$$\text{beta}=(w_{N1,1}+w_{N1,2}+w_{N1,3}+6h)/(w_{NL,2}+4h). \quad \text{(Equation 1)}$$

In general, if p number of fins are used for the pull-down N-channel triple-gate FET and q number of fins are used for the pass-gate N-channel triple-gate FET, the beta ratio is given by:

$$\text{beta}=[\Sigma_i^p{}_{=1}(w_{N1,i}+2h)]/[\Sigma_j^q{}_{=1}(w_{NL,j}+2h) ]. \quad \text{(Equation 2)}$$

In this invention, the rough adjustment of the beta ratio is achieved by adjusting the fin numbers p and q for the pull-down and pass-gate transistors, respectively, and fine adjustment is achieved by the fins widths $w_{N1,1}$ and $w_{NL,j}$. Fine adjustment of the beta ratio may also be achieved by modifying the channel lengths of the pull-down or pass-gate transistors.

The preceding explanation details the structural description of the SRAM cell configured using multiple-gate transistors. Next, a method is described for the formation of such a structure. A simple process flow for fabricating a triple-gate transistor or an omega-FET is to be described.

The fabrication process for the triple-gate transistor, the preferred embodiment of the present invention, is schematically described in FIGS. 12A–12D. FIGS. 12A–12D show the device 150 cross-section at the various process steps, as observed along line A–A' of the plane view of the completed device 150 overlying an insulator layer 154. The insulator layer 154 has a thickness of between about 20 Å and about 1000 Å. The insulator layer 154 can be made of any dielectric material such as silicon oxide. The dielectric material is preferably silicon oxide.

Figure 12A:
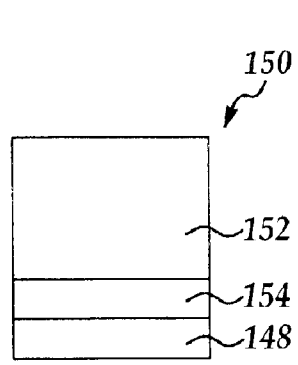
FIGS. 12A, 12B, 12C and 12D are cross-sectional views illustrating a process flow for the formation of a present invention triple-gate transistor.
Figure 12B:
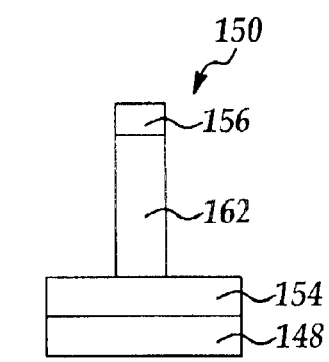
Figure 12C:
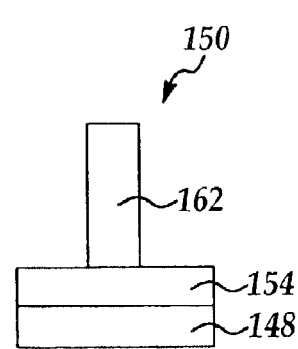
Figure 12D:
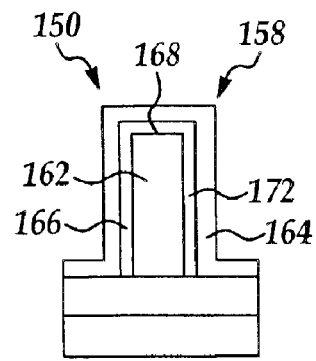

The silicon fins 152 are patterned using an etchant mask 156, as shown in FIG. 12B. The etchant mask 156 may comprise of a material commonly used for masking an etch process, such as photoresist, silicon oxide, silicon nitride, etch. In the preferred embodiment, the etchant mask is silicon oxide. In the present invention, an optional fin surface smoothing step is carried out to improve or reduce the surface roughness of the fin sidewalls. If the etchant mask used for fin definition is silicon oxide, as in the preferred embodiment, it may be removed before or after the fin smoothing process. The removal of the etchant mask 156 on the silicon fin 162 prior to gate dielectric formation allows the fabrication of a triple-gate 110 or an omega-FET device 120 since the gate electrode 158 will finally be formed on each of the two sidewalls 164,166 as well as the top surface 168 of the fin, as shown in FIG. 12C. If the etchant mask 156 used for fin definition is a photoresist, it has to be removed before the fin surface smoothening step to avoid the high temperatures used in the fin smoothing process. The fin surface smoothing is performed by subjecting the fin to a sacrificial oxidation and/or silicon sidewall treatment (e.g., high temperature anneal at 1000° C. in $H_2$ ambient). The surface smoothing of the fin sidewalls contributes to the achievement of good carrier mobilities. Depending on whether the silicon oxide etchant mask is removed prior to the fin smoothing process step, the shape of the fin may be square-like or rounded at the top. If the etchant mask may be retained on the fin throughout the process, the final device structure will be a double-gate device structure.

The process step is followed by gate dielectric layer 172 formation. The gate dielectric layer 172 may be formed by thermal oxidation, chemical vapor deposition, sputtering, etc. In general, the thickness of the gate dielectric layer 172 may be different on the sidewalls 164,166 of the fin and the top 168 of the fin. Depending on the technique of gate dielectric layer formation, the gate dielectric thickness on the top 168 of the fin may be thinner than the thickness on the fin sidewalls. In one embodiment, the gate dielectric thickness on the top surface 168 of the fin 162 is less than 20 Å. The gate dielectric layer may comprise of a conventional material such as silicon dioxide or silicon oxynitride with a thickness ranging from about 3 Å to about 100 Å, preferably 10 Å or less. The gate dielectric may also comprise of high permittivity (high-k) materials such as lanthalum oxide $la_2O_3$, aluminum oxide $Al_2O_{31}$, hafnium oxide $HfO_2$. Hafnium oxynitride HfON, or zirconium oxide ZrO2, with an equivalent oxide thickness of about 3 Å to about 100 Å.

Next the gate electrode material is deposited. The gate electrode material may be polycrystalline-silicon (poly-si) polycrystalline silicon-germanium (poly-SiGe), a refractory metal such as molybdenum and tungsten, compounds such as titanium nitride, or other conducting materials. A gate mask (not shown) is defined and the underlying gate material is etched to form the gate electrode 158. The gate etch stops on the gate dielectric layer 172, and the gate is electrically isolated from the transistor structure by the gate dielectric layer 172. In the preferred embodiment, the gate material is poly-Si and the gate dielectric is silicon oxynitride. A plasma etch using chlorine and bromine chemistry may be used to achieve a high etch selectivity. A high etch selectivity is critical for device structures with a tall fin and aggressively scaled gate dielectric thickness.

Figure 14:
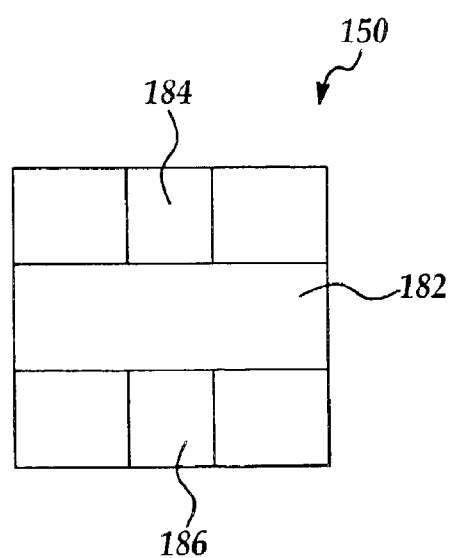
FIG. 14 is a plane view of a present invention triple-gate transistor or omega-FET.

After the definition of the gate, the gate mask can be removed. At this stage of the fabrication, the three-dimensional perspective of the device is illustrated in FIG. 9A for the triple-gate transistor 110, FIG. 9B for the omega-FET 120, and FIG. 3A for the double-gate transistor 50 (spacers and source/drain extensions not shown). The lightly-doped drain (LDD) or drain extension is formed next. This may be achieved by ion implantation, plasma immersion ion implantation (PIII), or other techniques known and used in the art. Next, a spacer 182 (shown in FIG. 14) is formed on the sidewalls of the gate electrode by techniques known and used in the art, e.g., deposition and selective etching of the spacer material. The spacer material may comprise a dielectric material such as silicon nitride or silicon dioxide. In the preferred embodiment, the spacer comprises of silicon nitride and oxide composite spacer. After spacer formation, source and drain regions 184,186 are doped by ion implantation, PIII, gas or solid source diffusion, or any other techniques known and used in the art. Any implant damage or amorphization can be annealed through subsequent exposure to elevated temperatures. The resistance of the source, drain, and gate can also be reduced by strapping the source 184, drain 186, and gate electrode 158 with a conductive material. The conductive material may be a metallic silicide such as titanium silicide, cobalt silicide, or nickel silicide, a metallic nitride such as titanium nitride and tantalum nitride, a metal such as tungsten and copper, or a heavily doped semiconductor such as n+ doped Si. In the preferred embodiment, the conductive material is nickel silicide which may be formed by a self-aligned silicide (salicide) process. In the source and drain regions 184,186, the conductive material may be formed on both the top 168 of the fin as well as the sidewalls 164,166 of the fin 162.

Next, contacts are formed to the source, drain, and gate regions using techniques known and used in the art. It is important to achieve a very low contact resistance in nanoscale devices. This completes the fabrication of the multiple-gate transistor.

Figure 13A:
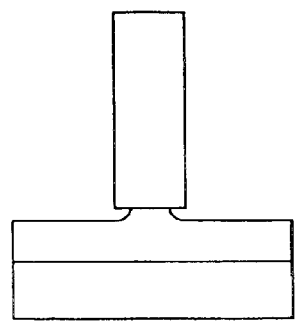
FIGS. 13A and 13B are cross-sectional views illustrating a process flow for the formation of a present invention omega-FET.
Figure 13B:
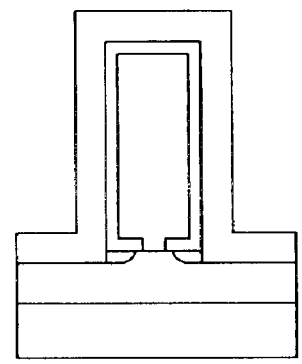

The fabrication process for the omega-FET 120 is similar to that of the triple-gate transistor 110. The fabrication of the omega-FET 120 adopts the same process as the triple-gate transistor 110 up to the fin formation step, as shown in FIG. 12C. Following FIG. 12C, a recess in the insulating layer is formed generally an etch process. FIG. 13A shows the cross-section of the device after the recess is formed. An example of an etch process is a wet etch using dilute hydrofluoric acid (HF) (formed by a mixture of 25 parts of water and 1 part of concentrated HF) for 30–600 seconds at 25° C. to etch about 50–1000 Å of thermally grown silicon oxide. In the preferred embodiment, the recess R (shown in FIG. 13B) is between about 20 Å and about 500 Å. After the formation of the recess, subsequent processes such as gate dielectric formation, gate electrode formation, and contact formation are exactly the same as that described for the triple-gate transistor.

While several embodiments of the invention, together with modifications thereof, have been described in detail herein and illustrated in the accompanying drawings, it will be evident that various modifications are possible without departing from the scope of the present invention. The examples given are intended to be illustrative rather than exclusive. The drawings may not necessarily be to scale and features may be shown in a schematic form.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A complementary metal-oxide-semiconductor static random access memory cell comprising:
    a pair of P-channel multiple-gate field-effect transistors (P-MGFETs), each of said P-MGFETs having a source connected to a common voltage potential and a gate connected to a drain of the other P-MGFET;

a first pair of N-channel multiple-gate field-effect transistors (N-MGFETs), each of said N-MGFETs having a drain connected to the drain of a respective P-MGFET of the pair of P-MGFETs, a source connected to ground, and a gate connected to the drain of an opposite P-MGFET of the pair of P-MGFETs;

a second pair of N-MGFETs having a drain respectively connected to a connection linking a respective drain of the N-MGFET of the first pair of N-MGFETs to the drain of the P-MGFET of the pair of P-MGFETs;

a pair of complementary bit lines, each of said plurality of bit lines respectively connected to a source of an N-MGFET of the second pair of N-MGFETS; and a word line connected to gates of an N-MGFETs of said second pair of N-MGFETs.

2. The complementary metal-oxide-semiconductor static random access memory cell of claim 1, wherein said pair of P-channel multiple-gate field-effect transistors are pull-up devices and said first pair of N-channel multiple-gate field-effect transistors are pull-down devices.

3. The complementary metal-oxide-semiconductor static random access memory cell of claim 1, wherein a first P-MGFET of the pair of P-MGFETs and a first N-MGFET of the first pair of N-MGFETs form a first inverter, and wherein a second P-MGFET of the pair of P-MGFETs and a second N-MGFET of the first pair of N-MGFETs form a second inverter, said first and second inverters being cross-coupled to each other.

4. The complementary metal-oxide-semiconductor static random access memory cell of claim 1, wherein the conductance of each of said first pair of N-MGFETs is larger than the conductance of each of said second pair of N-MGFETs.

5. The complementary metal-oxide-semiconductor static random access memory cell of claim 1, wherein said P-channel or N-channel multiple-gate field-effect transistors are double-gate field-effect transistors.

6. The complementary metal-oxide-semiconductor static random access memory cell of claim 1, wherein said P-channel or N-channel multiple-gate field-effect transistors are triple-gate field-effect transistors.

7. The complementary metal-oxide-semiconductor static random access memory cell of claim 1, wherein said P-channel or N-channel multiple-gate field-effect transistors are omega field-effect transistors.

8. The complementary metal-oxide-semiconductor static random access memory cell of claim 1, wherein said P-channel and N-channel multiple-gate field-effect transistors each comprises:

a substrate having an insulating layer on a top surface;

at least one semiconductor fin formed vertically on said top surface of the substrate, said at least one fin having a top surface and two sidewall surfaces;

a gate dielectric layer overlying said at least one semiconductor fin;

at least one gate electrode wrapping around said at least one semiconductor fin on said top surface and said two sidewall surfaces overlying said gate dielectric layer; and source and drain regions separated by said at least one gate electrode.

9. The complementary metal-oxide-semiconductor static random access memory cell of claim 8, wherein said at least one semiconductor fin being at least two semiconductor fins each having a width different than the other.

10. The complementary metal-oxide-semiconductor static random access memory cell of claim 8, wherein said at least one semiconductor fin comprises silicon.

11. The complementary metal-oxide-semiconductor static random access memory cell of claim 8, wherein said at least one semiconductor fin comprises silicon and germanium.

12. The complementary metal-oxide-semiconductor static random access memory cell of claim 8, wherein said insulating layer comprises a dielectric material.

13. The complementary metal-oxide-semiconductor static random access memory cell of claim 8, wherein said insulating layer comprises silicon oxide.

14. The complementary metal-oxide-semiconductor static random access memory cell of claim 8, wherein said insulating layer has a thickness of between about 20 Å and about 1000 Å.

15. The complementary metal-oxide-semiconductor static random access memory cell of claim 8, wherein said gate dielectric layer comprises silicon oxide.

16. The complementary metal-oxide-semiconductor static random access memory cell of claim 8, wherein said gate dielectric layer comprises silicon oxynitride.

17. The complementary metal-oxide-semiconductor static random access memory cell of claim 8, wherein said gate dielectric layer comprises a high permittivity material selected from the group consisting of $La_2O_3$, $Al_2O_3$, $HfO_2$, HfON and $ZrO_2$.

18. The complementary metal-oxide-semiconductor static random access memory cell of claim 8, wherein said gate dielectric layer comprises a high permittivity material having a relative permittivity of at least 5.

19. The complementary metal-oxide-semiconductor static random access memory cell of claim 8, wherein said gate dielectric has a thickness of between about 3 Å and about 100 Å.

20. The complementary metal-oxide-semiconductor static random access memory cell of claim 8, wherein said gate dielectric layer having a first thickness on the top surface of the fin and a second thickness on the sidewall surfaces of the fin, said first thickness being different than said second thickness.

21. The complementary metal-oxide-semiconductor static random access memory cell of claim 20, wherein said first thickness being smaller than said second thickness.

22. The complementary metal-oxide-semiconductor static random access memory cell of claim 8, wherein a thickness of said gate dielectric layer on the top surface of the semiconductor fin is less than 20 Å.

23. The complementary metal-oxide-semiconductor static random access memory cell of claim 8, wherein said at least one gate electrode comprises polycrystalline silicon.

24. The complementary metal-oxide-semiconductor static random access memory cell of claim 8, wherein said at least one gate electrode comprises polycrystalline silicon germanium.

25. The complementary metal-oxide-semiconductor static random access memory cell of claim 8, wherein said gate electrode comprises a metal.

26. The complementary metal-oxide-semiconductor static random access memory cell of claim 8, wherein each of said first pair of N-MGFETs comprises a first number of fins, each of said second pair of N-MGFETs comprises a second number of fins, the first number being different from the second number.

27. The complementary metal-oxide-semiconductor static random access memory cell of claim 8, wherein said first pair of N-MGFETs shares said at least one semiconductor fin with said second pair of N-MGFETs.

28. The complementary metal-oxide-semiconductor static random access memory cell of claim 8, wherein said first pair of N-MGFETs and said second pair of N-MGFETs do not share any of said at least one semiconductor fin.

29. The complementary metal-oxide-semiconductor static random access memory cell of claim 8, wherein contacts to said source or drain regions are made on at least one of the sidewall surfaces of said at least one semiconductor fin.

30. An array of static random access memory (SRAM) cells formed by a plurality of SRAM cells arranged in an n by m matrix, wherein n and m are integers greater than 1, wherein each of said plurality of SRAM cell comprising:
 a pair of P-channel multiple-gate field-effect transistors (P-MGFETs), each of the P-MGFETs having a source connected to a common voltage potential and a gate connected to a drain of the other P-MGFET;
 a first pair of N-channel multiple-gate field-effect transistors (N-MGFETs), each of said first pair of N-MGFETs having a drain connected to the drain of a respective P-MGFET of the pair of P-MGFETs, a common source connected to ground, and a gate connected to the drain of an opposite P-MGFET of the pair of P-MGFETs;
 a second pair of N-MGFETs having a drain respectively connected to a connection linking a respective drain of the N-MGFET of the first pair of N-MGFETs to the drain of the P-MGFET of the pair of P-MGFETs;
 a pair of complementary bit lines, each of said complementary bit lines respectively connected to a source of an N-MGFET of the second pair of N-MGFETs;
 a plurality of word lines, each of the word lines connected to gates of an N-MGFETs of the second pair of N-MGFETs;
 n pairs of complementary bit lines, each of the n pairs of the complementary bit lines linking respective sources of the N-MGFETs of the second pair of N-MGFETs of each of the SRAM cells to form columns of the array; and
 m word lines, each of the m word lines linking respective gates of the N-MGFETs of the second pair of N-MGFETs of each of the SRAM cells to form rows of the array.

31. The array of claim 30, wherein said pair of P-channel multiple-gate field-effect transistors are pull-up devices and said first pair of N-channel multiple-gate field-effect transistors are pull-down devices.

32. The array of claim 30, wherein a first P-MGFET of said pair of P-MGFETs and a first N-MGFET of said first pair of N-MGFETs form a first inverter, and a second P-MGFET of said pair of P-MGFETs and a second N-MGFET of said first pair of N-MGFETs form a second inverter, said first and second inverters being cross-coupled to each other.

33. The array of claim 30, wherein a conductance of each of said first pair of N-MGFETs is larger than a conductance of each of said second pair of N-MGFETs.

34. The array of claim 30, wherein said P-channel or N-channel multiple-gate field-effect transistors are double-gate field-effect transistors.

35. The array of claim 30, wherein said P-channel or N-channel multiple-gate field-effect transistors are triple-gate field-effect transistors.

36. The array of claim 30, wherein said P-channel or N-channel multiple-gate field-effect transistors are omega field-effect transistors.

37. The array of claim 30, wherein each of said P-channel and N-channel multiple-gate field-effect transistors further comprises:
 a substrate having an insulating layer on a top surface;
 at least one semiconductor fin formed vertically on said top surface of the substrate, each fin having a top surface and two sidewall surfaces;
 a gate dielectric layer overlying said at least one semiconductor fin;
 a gate electrode wrapping around said at least one semiconductor fin on said top surface and said two sidewall surfaces overlying said gate dielectric layer; and
 source and drain regions separated by said gate electrode.

38. The array of claim 37, wherein said at least one semiconductor fin being at least two semiconductor fins each having a width different than the other.

39. The array of claim 37, wherein said at least one semiconductor fin comprises silicon.

40. The array of claim 37, wherein said at least one semiconductor fin comprises silicon and germanium.

41. The array of claim 37, wherein said insulating layer comprises a dielectric material.

42. The array of claim 37, wherein said insulating layer comprises silicon oxide.

43. The array of claim 37, wherein said insulating layer having a thickness between about 20 Å and about 1000 Å.

44. The array of claim 37, wherein said gate dielectric layer comprises silicon oxide.

45. The array of claim 37, wherein said gate dielectric layer comprises silicon oxynitride.

46. The array of claim 37, wherein said gate dielectric layer comprises a high permittivity material selected from the group consisting of $La_2O_3$, $Al_2O_3$, $HfO_2$, HfON and $ZrO_2$.

47. The array of claim 37, wherein said gate dielectric layer comprises a high permittivity material having a relative permittivity of at least 5.

48. The array of claim 37, wherein said gate dielectric layer having a thickness between about 3 Å and about 100 Å.

49. The array of claim 37, wherein said gate dielectric layer having a first thickness on the top surface of the fin and a second thickness on the sidewall surfaces of the fin, said first thickness being different than said second thickness.

50. The array of claim 49, wherein said first thickness being smaller than said second thickness.

51. The array of claim 37, wherein a thickness of said gate dielectric layer on the top surface of the at least one semiconductor fin is less than 20 Å.

52. The array of claim 37, wherein said gate electrode comprises polycrystalline silicon.

53. The array of claim 37, wherein said gate electrode comprises polycrystalline silicon germanium.

54. The array of claim 37, wherein said gate electrode comprises a metal.

55. The array of claim 37, wherein each of said first pair of N-MGFETs comprises a first number of semiconductor fins, each of said second pair of N-MGFETs comprises a second number of semiconductor fins, the first number being different from the second number.

56. The array of claim 37, wherein said first pair of N-MGFETs shares a plurality of semiconductor fins with said second pair of N-MGFETs.

57. The array of claim 37, wherein said first pair of N-MGFETs and said second pair of N-MGFETs do not share any semiconductor fins.

* * * * *